(12) United States Patent
Kuo et al.

(10) Patent No.: US 8,780,293 B2
(45) Date of Patent: Jul. 15, 2014

(54) LIQUID CRYSTAL DISPLAY DEVICE, BACKLIGHT MODULE AND FRAME UNIT THEREOF

(75) Inventors: Yi-cheng Kuo, Guandong (CN); Yu-chun Hsiao, Guandong (CN); Chengwen Que, Guandong (CN); Pangling Zhang, Guandong (CN); Dehua Li, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 136 days.

(21) Appl. No.: 13/578,615

(22) PCT Filed: Jul. 24, 2012

(86) PCT No.: PCT/CN2012/079104
§ 371 (c)(1),
(2), (4) Date: Aug. 11, 2012

(87) PCT Pub. No.: WO2014/012267
PCT Pub. Date: Jan. 23, 2014

(65) Prior Publication Data
US 2014/0022483 A1    Jan. 23, 2014

(30) Foreign Application Priority Data
Jul. 17, 2012  (CN) .......................... 2012 1 0247369

(51) Int. Cl.
*G02F 1/1333*    (2006.01)
(52) U.S. Cl.
USPC ................. 349/60; 349/58; 349/65; 362/633; 362/97.2

(58) Field of Classification Search
CPC .................. G02F 1/133615; G02F 1/133308; G02F 1/1333; G02F 1/133608; G02F 1/157; G02F 2001/133317; G02F 2001/133314; G02F 2201/46; G02F 2201/465; G02F 1/1601; G02F 1/16; F21V 21/00; F21V 15/01; F21V 19/00
USPC ........ 349/58, 65, 62, 60; 362/97.1, 97.2, 615, 362/249.01, 633, 382; 348/794
See application file for complete search history.

(56) References Cited

U.S. PATENT DOCUMENTS

2008/0143918 A1* 6/2008 Kim ................................ 349/58
2010/0014026 A1* 1/2010 Inoue .............................. 349/65

* cited by examiner

*Primary Examiner* — Thoi Duong
(74) *Attorney, Agent, or Firm* — Andrew C. Cheng

(57) ABSTRACT

The present invention provides a liquid crystal display device, backlight module and frame unit thereof. The frame unit comprises: back frame and resilient fastening element. The back frame comprises: bottom plate and connected side wall. The bottom plate is for carrying optical part of backlight module. The resilient fastening element comprises a first support part, a second support part, and a side plate. The first support part contacts the bottom plate, the second support part is for supporting liquid crystal panel, and a positioning trench formed between the first support part and the second support part is for clamping a side of the optical part, the second support part is located between the liquid crystal panel and the optical part, and the side plate and the side wall are disposed correspondingly. The present invention can replace known mold frame with frame unit to reduce cost.

16 Claims, 4 Drawing Sheets

LIQUID CRYSTAL DISPLAY DEVICE, BACKLIGHT MODULE AND FRAME UNIT THEREOF

BACKGROUND OF THE INVENTION

1. Field of the Invention

The present invention relates to the field of liquid crystal displaying techniques, and in particular to a liquid crystal display device, backlight module and frame unit thereof.

2. The Related Arts

Liquid crystal display device is a common display device. The known liquid crystal display device comprises an assembly of back plate, mold frame, optical part and liquid crystal panel, wherein mold frame is an indispensible part of a liquid crystal display device. The function of the mold frame is to accommodate, fasten and protect the optical part and liquid crystal panel.

However, the manufacturing cost of the known mold frame is often high, and a liquid crystal display device usually comprises several mold frames. Hence, the cost of liquid crystal display device is increased because of the mold frame.

SUMMARY OF THE INVENTION

The technical issue to be addressed by the present invention is to provide a liquid crystal display device, backlight module and frame unit thereof. The frame unit comprises a resilient fastening element to replace the known mold frame structure so as to solve the problems of high cost and inconvenient assembly of using mold frame.

The present invention provides a frame unit for backlight module, which comprises: back frame and resilient fastening element. The back frame comprises: bottom plate and connected side wall, wherein the bottom plate is for carrying optical part of the backlight module. The resilient fastening element comprises a first support part, a second support part, and a side plate connected to first support part and second support part, all monolithically formed, wherein the first support part contacts the bottom plate, the second support part is for supporting liquid crystal panel, a positioning trench formed between the first support part and the second support part is for clamping a side of the optical part, the second support part is located between the liquid crystal panel and the optical part, and the side plate and the side wall are disposed correspondingly.

According to a preferred embodiment of the present invention, the resilient fastening element is made of silicone or rubber.

According to a preferred embodiment of the present invention, the number is resilient fastening plural, and the plurality of resilient fastening elements is disposed with spacing gap on a plurality of sides of the optical part.

According to a preferred embodiment of the present invention, the resilient fastening element is L-shaped, and the L-shaped resilient fastening element is disposed on the corner of optical part and clamping simultaneously on two sides near the corner through positioning trench.

According to a preferred embodiment of the present invention, the positioning trench is U-shaped and fits the side interference of the optical part.

According to a preferred embodiment of the present invention, the bottom plate comprises bump part and concave trench part located between the bump part and the side wall, the first support part is disposed inside the concave trench part and a surface of the first support part away from the concave trench part is at a same level with the bump part.

According to a preferred embodiment of the present invention, the side plate and the side wall are disposed against each other.

According to a preferred embodiment of the present invention, the number of bottom plates and the side walls are plural, and the back frame is formed by splicing a plurality of bottom plates and a plurality of side walls.

The present invention provides a backlight module, which comprises: optical part and frame unit, wherein the frame unit comprises: back frame and resilient fastening element. The back frame comprises: bottom plate and connected side wall, wherein the bottom plate is for carrying optical part of the backlight module. The resilient fastening element comprises a first support part, a second support part, and a side plate connected to first support part and second support part, all monolithically formed, wherein the first support part, contacts the bottom plate, the second support part is for supporting liquid crystal panel, a positioning trench formed between the first support part and the second support part is for clamping a side of the optical part, the second support part is located between the liquid crystal panel and the optical part, and the side plate and the side wall are disposed correspondingly. The optical part comprises: light-guiding plates and optical films, disposed in stacks, the light-guiding plates contact the first support part and the optical films contact the second support part.

According to a preferred embodiment of the present invention, the resilient fastening element is made of silicone or rubber.

According to a preferred embodiment of the present invention, the number is resilient fastening plural, and the plurality of resilient fastening elements is disposed with spacing gap on a plurality of sides of the optical part.

According to a preferred embodiment of the present invention, the resilient fastening element is L-shaped, and the L-shaped resilient fastening element is disposed on the corner of optical part and clamping simultaneously on two sides near the corner through positioning trench.

According to a preferred embodiment of the present invention, the positioning trench is U-shaped and fits the side interference of the optical part.

The present invention provides a liquid crystal display device, which comprises: a liquid crystal panel and the aforementioned backlight module, wherein the second support part is disposed between the optical film and the liquid crystal panel to support the liquid crystal panel.

According to a preferred embodiment of the present invention, the resilient fastening element is made of silicone or rubber.

According to a preferred embodiment of the present invention, the positioning trench is U-shaped and fits the side interference of the optical part.

The efficacy of the present invention is that to be distinguished from the state of the art. The frame unit of the present invention comprises back frame and resilient fastening element, wherein the resilient fastening element has positioning trench to accommodate optical part and support liquid crystal panel. Therefore, the resilient fastening element can replace the known mold frame. In addition, the resilient fastening element can effectively reduce the cost of the frame unit and the entire liquid crystal display device as well as facilitate convenient assembly of the liquid crystal display device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following description refers drawings and embodiments of the present invention. It should be noted that the embodiments are only illustrative, not restrictive for the scope of the present invention.

Figure 1:
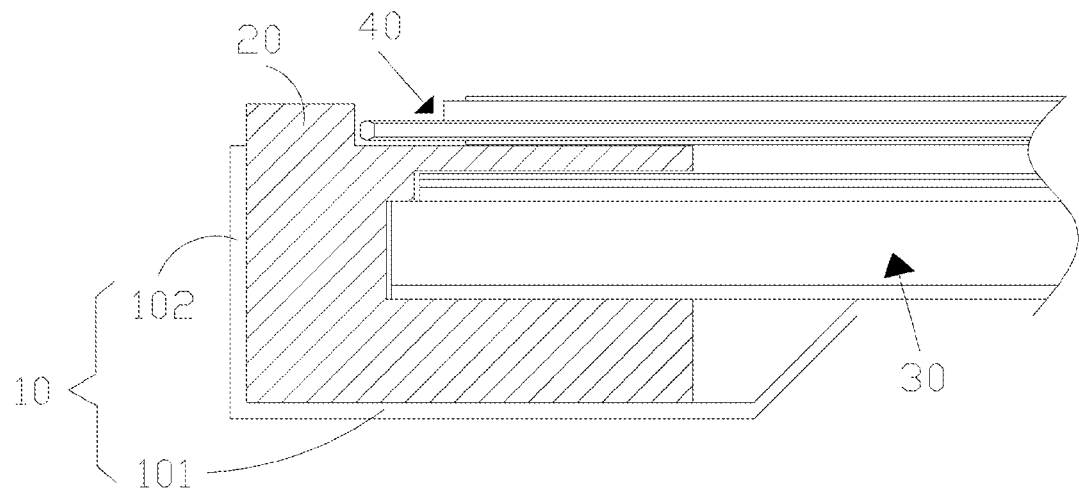
FIG. 1 is a schematic view showing the partial structure of main component of the first embodiment of liquid crystal display device according to the present invention.

Refer to FIG. 1. In the first embodiment of the present invention, a frame unit for backlight module comprises: back frame 10 and resilient fastening element 20. The frame unit, optical part 30 and liquid crystal panel 40 form a liquid crystal display device (obviously, only the main parts of the liquid crystal display device related to the present invention are listed here). The following describes specific structure of back frame 10 and resilient fastening element 20.

Back frame 10 comprises bottom plate 101 and connected side wall 102. Specifically, side wall 102 is disposed on bottom plate 101 and bottom plate 101 supports side wall 102. Bottom plate 101 and side wall 102 can be formed monolithically when manufactured, but can also be connected through rivet or screws. No specific restriction is imposed here.

In the instant embodiment, bottom plate 101 can be, but not restricted to, a plate structure. Bottom plate 101 is for carrying optical part 30. It should be noted that bottom plate 101 can be shaped as rectangle, cylinder, or ladder platform, as long as providing a support surface for carrying optical part 30. No specific restriction is imposed here. Bottom plate 101 comprises bump part and concave trench part. The bump part is in direct contact with and supports optical part 30, or contacts optical part 30 through soft flake, such as, gel pad. The soft flake can protect optical part 30 from scratch. The concave trench is located between the bump part and the side wall and forms a space to accommodate resilient fastening element 20. Obviously, concave trench and resilient fastening element 20 are disposed correspondingly. As shown in FIG. 1, the joint of the bump part and the concave part is a bend, which can be shaped as a slope as shown in FIG. 1 or a vertical surface downward, and no specific restriction is imposed here.

As aforementioned, bottom plate 101 and side wall 102 can be formed monolithically when manufactured, but can also be connected through rivet or screws. Similarly, back frame 10 can also be monolithically formed, or by splicing a plurality of bottom plate 101 and a plurality of side walls 102. No specific restriction is imposed here. In other words, back frame 10 can be a monolithically formed rectangular frame (comprising a bottom plate 101 and a connected side wall 102; alternatively, bottom plate 101 and side wall 102 can form a "back frame element" first and a plurality of back frame elements are assembled to form back frame 10.

Figure 2:
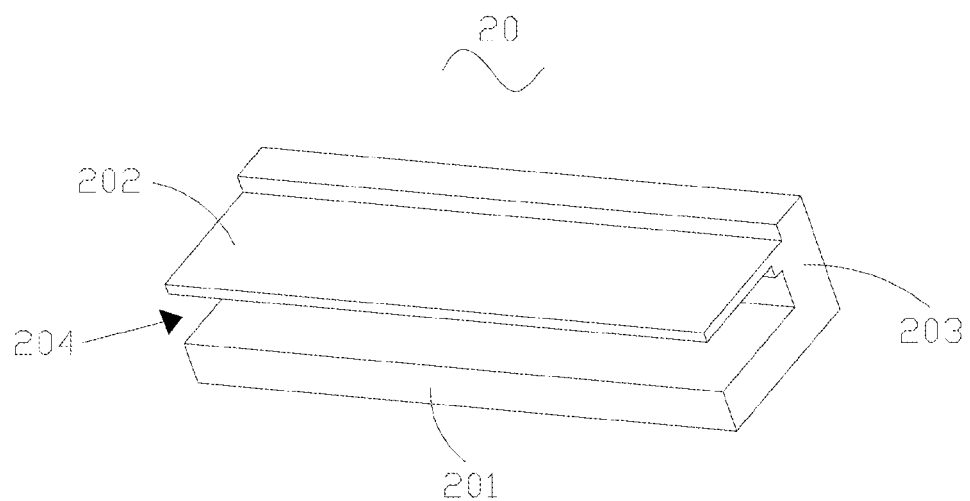
FIG. 2 is a schematic view showing the structure of resilient fastening element of the first embodiment.
Figure 3:
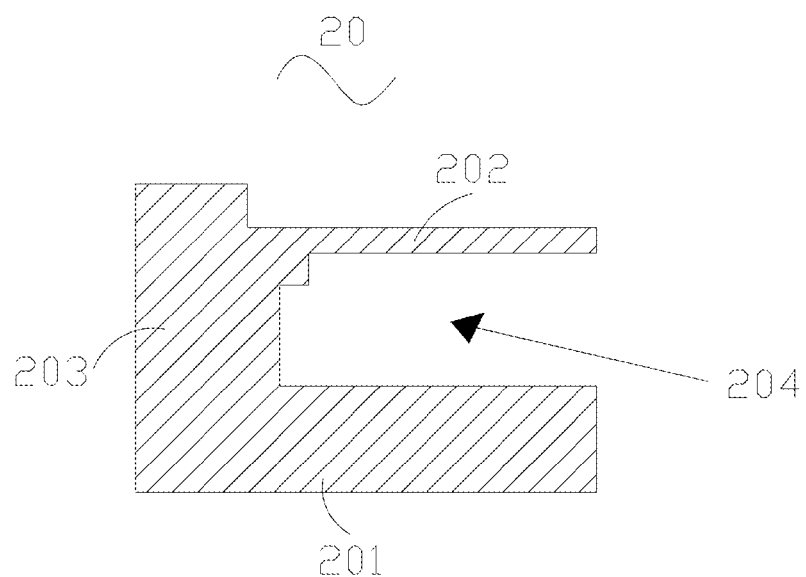
FIG. 3 is a dissected view of the resilient fastening element shown in FIG. 2.
Figure 4:
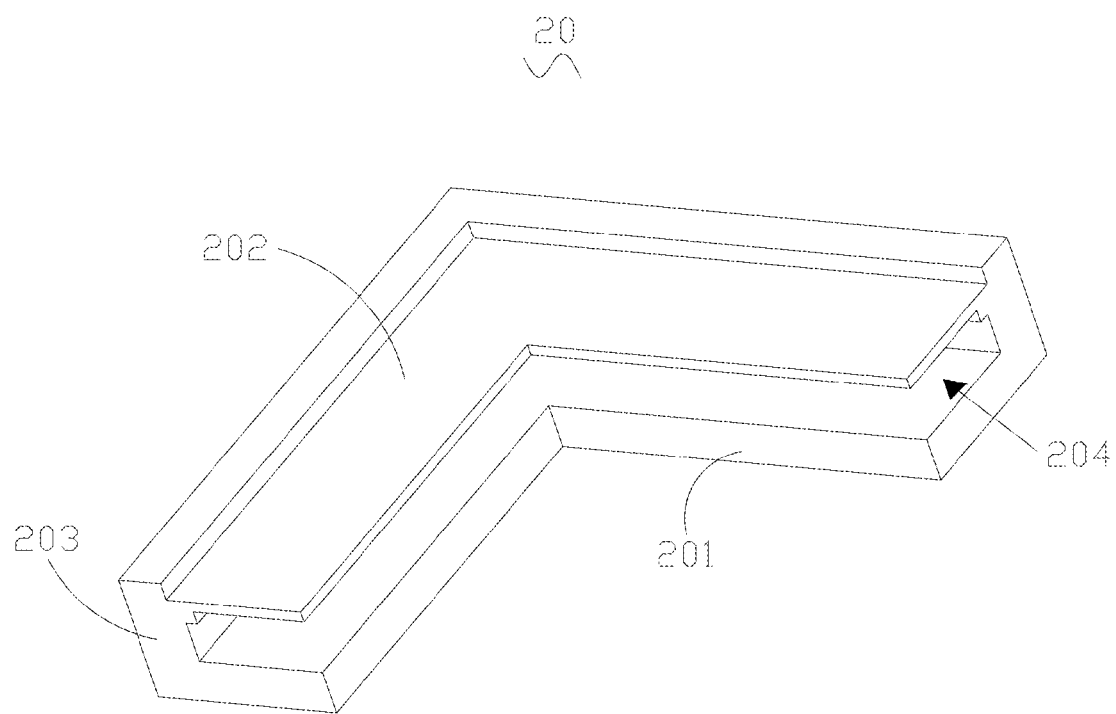
FIG. 4 is a schematic view showing the structure of resilient fastening element of another embodiment.

Refer to FIGS. 2-4 simultaneously. Resilient fastening element 20 comprises a first support part 201, a second support part 202, and a side plate 203 connected to first support part 201 and second support part 202. Obviously, resilient fastening element 20 can be monolithically formed, or by splicing first support part 201, second support part 202 and side plate 203. No specific restriction is imposed here. In addition, other means of connections, such as, rivet or screws, are also within the scope of the present invention.

It should be understood that resilient fastening element 20 is simple in structure and thus is easy to manufactured and understood by people with ordinary skill in this field. Therefore, the cost of manufacturing resilient fastening element 20 is reduced.

Resilient fastening element 20 is placed inside concave trench part of back frame 10. At this point, side plate 203 and side wall 102 are disposed against each other, and bottom surface of first support part 201 contacts bottom plate 101. Upper surface of first support part 201 is at a same level with the bump part of bottom plate 10 so that optical part 30, such as light-guiding plates, can be placed levelly. Second support part 202 is for supporting liquid crystal panel 40. A positioning trench 204 is formed between first support part 201 and second support part 202 for clamping optical part 30. Specifically, liquid crystal panel 40 is placed on second support unit 202 and the space between first support part 201 and second support part 202 accommodates a side of optical part 30 in an interference fit manner so as to fasten optical part 30 in positioning trench 204. In general, positioning trench 204 can be U-shaped, but is not restricted to U-shaped. Other shapes can also be used as long as able to accommodate optical part 30. No specific restriction is imposed here.

It should be noted that resilient fastening element 20 and back frame 10 has a correspondence relation. In the instant embodiment, side plate 203 of resilient fastening element 20 and side wall 102 of back frame 10 are disposed correspondingly. It should be understood that the disposition can be realized in different ways. For example, both can be planes can connected side-by-side. Alternatively, positioning stubs can be disposed on side plate 203 and matching positioning holes are disposed on side wall 102 for connection. Side plates 203 and side walls 102 can also be disposed in interleaving manner, or with gel pads inserted to glue together. Other equivalent means of connections are also within the scope of the present invention.

Similarly, first support part 201 of resilient fastening element 20 and bottom plate 101 of back frame 10 can be also be connected in various ways.

Resilient fastening element 20 is to accommodate, fasten and protect optical part 30, such as light-guiding plates. Therefore, resilient fastening element 20 is made of soft material.

In the instant embodiment, resilient fastening element 20 is made of silicone or rubber. Compared the conventional mold frame material, silicone or rubber is lower in cost. Therefore, resilient fastening element 20 of the present invention has the advantage of low cost to further reduce the cost of frame unit. Because the frame unit is an indispensible component in manufacturing backlight module and liquid crystal display device, the low-cost silicone or rubber of resilient fastening element 20 can reduce the overall cost of liquid crystal display device.

It should be understood that in other embodiments, resilient fastening element 20 can also be made of other soft materials as long as the cost is relatively low, for example, recycled plastic or rubber. Therefore, the silicone and rubber cited above is only preferred and illustrative, instead of restrictive on the material of resilient fastening element 20.

Figure 5:
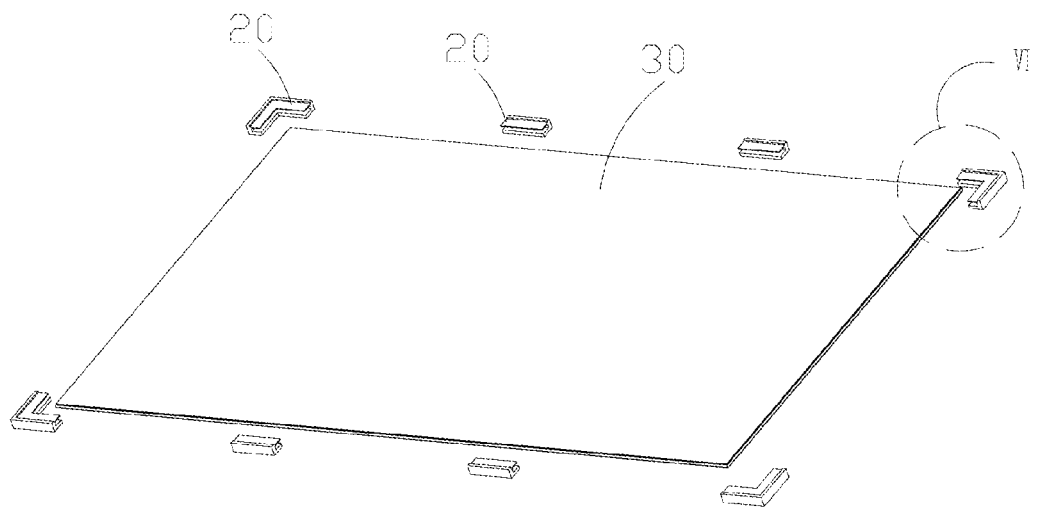
FIG. 5 is a schematic view showing the assembling of resilient fastening element and optical part according to the embodiment of the present invention.
Figure 6:
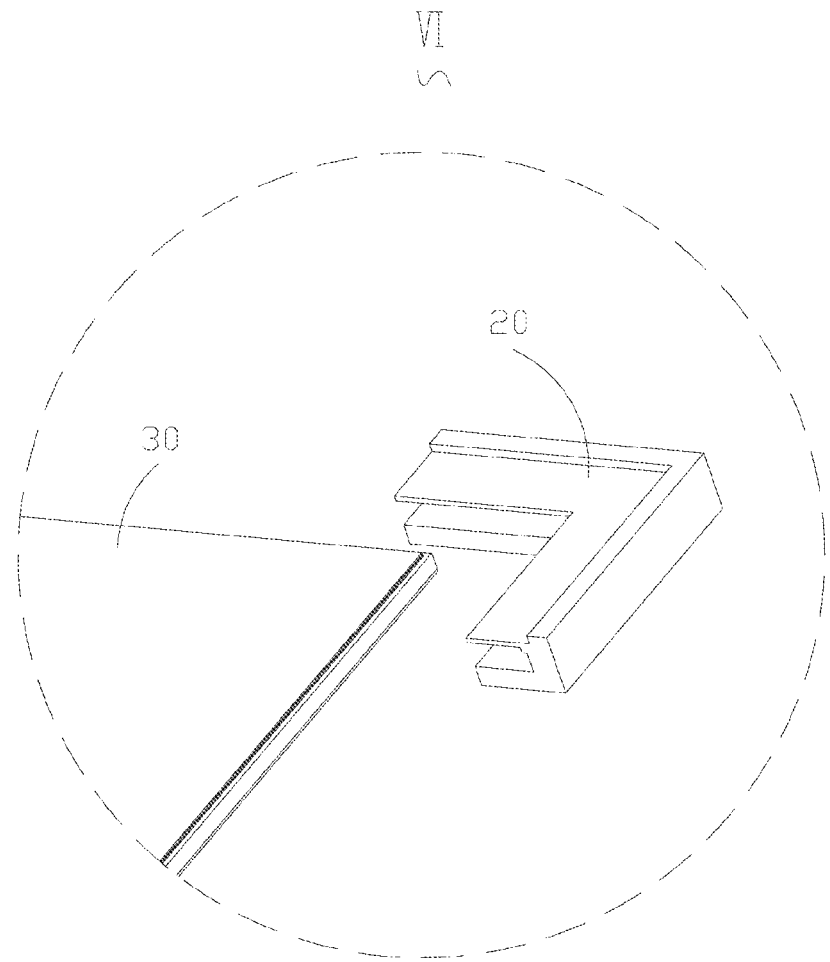
FIG. 6 is an enlarged schematic view showing VI partial structure during the assembling of resilient fastening element and optical part shown in FIG. 5.
Figure 7:
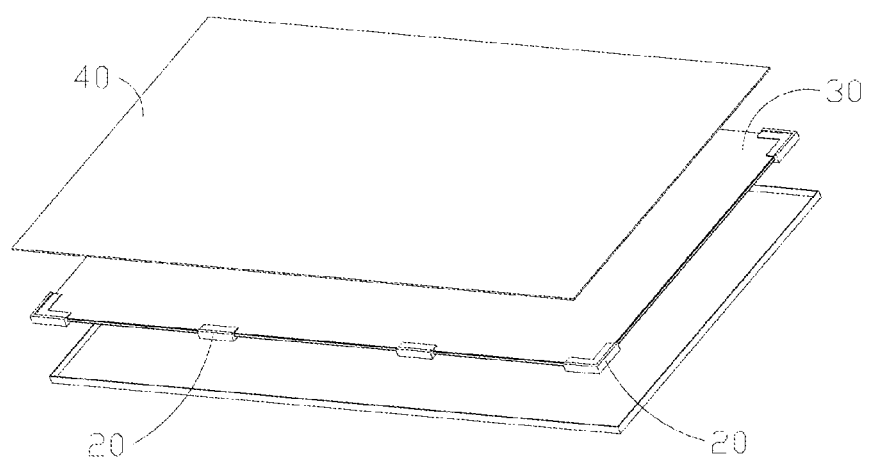
FIG. 7 is a schematic view showing the assembling of the liquid crystal display device according to the embodiment of the present invention.
Figure 8:
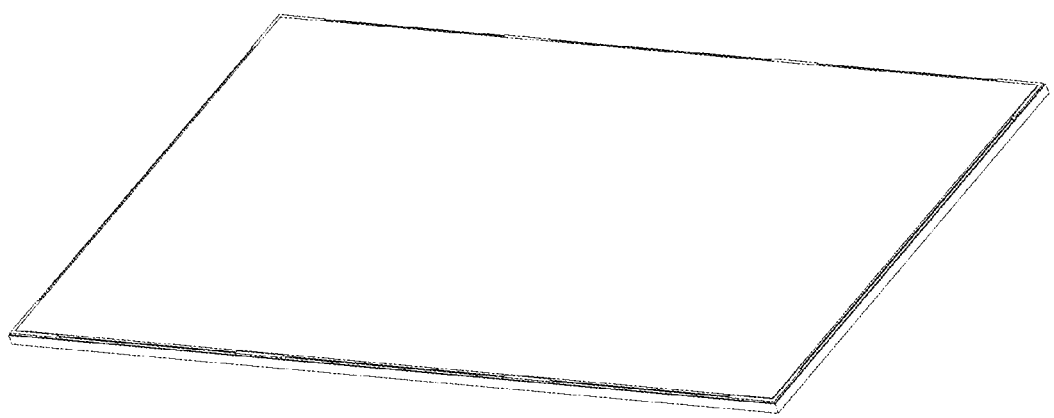
FIG. 8 is a schematic view showing the structure of the assembled liquid crystal display device shown in FIG. 7.

Refer to FIG. 5. In addition, this embodiment comprises a plurality of resilient fastening elements 20. The plurality of resilient fastening elements 20 is disposed with spacing gap on a plurality of sides of optical part 30 to perform positioning on optical part 30 at different positions to achieve better effect. In particular, resilient fastening element 20 can be L-shaped, and the L-shaped resilient fastening element 20 is disposed on the corner of optical part 30. At this point, positioning trench 204 clamps simultaneously on two sides near the corner. Similarly, two U-shaped resilient fastening elements 20 can be disposed to engage at two diagonal corners of optical part 30.

It should be noted that the present invention imposes no specific restriction on the number or shapes of the resilient fastening element 20 as long as the combination can effectively accommodate, fasten and protect optical part 30 and supports liquid crystal panel 40. For example, to further save material can reduce cost, four L-shaped resilient fastening element 20 can be disposed on the four corners of optical part 30. For better stability or protection of optical part 30, additional stripe resilient fastening element 20 can be added to the four L-shaped resilient fastening element 20 on the sides of optical part 30 (as shown in FIG. 5).

The above examples are only to illustrate any combinations of shape and number of resilient fastening element 20 can effectively accommodate, fasten and protect optical part 30 and supports liquid crystal panel 40, and should not be understood as restriction on the design of resilient fastening element 20.

The following describes the assembling of liquid crystal display device. Refer to FIGS. 5-8. In the instant embodiment, the main parts of liquid crystal display device comprise light source (not shown), frame unit, optical part 30 and liquid crystal panel 40. It should be noted that the description of assembling process is only for illustrative purpose, instead of restrictive. The assembling process comprises the following steps.

First, optical part 30 is stacked in order.

Then, the stacked optical part 30 is inserted into positioning trench 204 so that resilient fastening element 20 engages optical part 30. As aforementioned, resilient fastening element 20 can be disposed on side of optical part 30 or corner of optical part 30. Number of resilient fastening element 20 can also be varied.

Then, the already assembled resilient fastening element 20 and optical part 30 are placed in back frame 10. Specifically, side plate 203 of resilient fastening element 20 and side wall 102 of back frame 10 are disposed against each other so that first support part 201 of resilient fastening element 20 contacts bottom plate 101 of back frame 10, and optical part 30 is supported by both first support part 201 and the bump part.

Finally, liquid crystal panel 40 is placed on second support part 202.

It should be noted that the above process only lists steps related to the present invention, rather than a complete assembly process. A complete assembly process for liquid crystal display device clearly comprises other steps, such as, using mold frame or other means to fasten liquid crystal panel 40.

The frame unit of the first embodiment of the present invention comprises using positioning trench 204 of the resilient fastening element 20 to accommodate optical part 30 and support liquid crystal panel 40, and use resilient fastening element 20 to replace the known mold frame. In addition, the resilient fastening element 20 can effectively reduce the cost of the frame unit and the entire liquid crystal display device as well as facilitate convenient assembly of the liquid crystal display device.

Another embodiment of the present invention provides a backlight module, which comprises optical part and frame unit of the earlier embodiment, wherein the optical part comprises stacked light-guiding plates and optical films. Light-guiding plate is beneath optical film. It should be noted that light-guiding plate contacts the first support part and optical film contacts the second support part. Because the structure and features of the frame unit are already described in earlier embodiment, the description will not be repeated here.

The present invention also provides a liquid crystal display device, which comprises a liquid crystal panel and the aforementioned backlight module. Because the structure and features of the frame unit and backlight module are already described in earlier embodiment, the description will not be repeated here.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A frame unit for backlight module, which comprises:
   back frame, comprising: a bottom plate and a side wall connected to the bottom plate, the bottom plate for carrying optical part of the backlight module;
   resilient fastening element, comprising a first support part, a second support part, and a side plate connected to first support part and second support part, all monolithically formed, the first support part contacting the bottom plate, the second support part being for supporting liquid crystal panel, a positioning trench formed between the first support part and the second support part being for clamping a side of the optical part, the second support part being located between the liquid crystal panel and the optical part, and the side plate and the side wall being disposed correspondingly.

2. The frame unit as claimed in claim 1, characterized in that the resilient fastening element is made of silicone or rubber.

3. The frame unit as claimed in claim 1, characterized in that the number is resilient fastening plural, and the plurality of resilient fastening elements is disposed with spacing gap on a plurality of sides of the optical part.

4. The frame unit as claimed in claim 3, characterized in that the resilient fastening element is L-shaped, and the L-shaped resilient fastening element is disposed on the corner of optical part and clamping simultaneously on two sides near the corner through positioning trench.

5. The frame unit as claimed in claim 1, characterized in that the positioning trench is U-shaped and fits side interference of the optical part.

6. The frame unit as claimed in claim 1, characterized in that the bottom plate comprises bump part and concave trench part located between the bump part and the side wall, the first support part is disposed inside the concave trench part and a surface of the first support part away from the concave trench part is at a same level with the bump part.

7. The frame unit as claimed in claim 1, characterized in that the side plate and the side wall are disposed against each other.

8. The frame unit as claimed in claim 1, characterized in that the number of bottom plates and the side walls are plural, and the back frame is formed by splicing a plurality of bottom plates and a plurality of side walls.

9. A backlight module, which comprises: optical part and frame unit; the frame unit further comprises:
- back frame, comprising: a bottom plate and a side wall connected to the bottom plate, the bottom plate for carrying optical part of the backlight module;
- resilient fastening element, comprising a first support part, a second support part, and a side plate connected to first support part and second support part, all monolithically formed, the first support part contacting the bottom plate, the second support part being for supporting liquid crystal panel, a positioning trench formed between the first support part and the second support part being for clamping a side of the optical part, the second support part being located between the liquid crystal panel and the optical part, and the side plate and the side wall being disposed correspondingly;
- the optical part further comprises: stacked light-guiding plates and optical films, the light-guiding plates contacting the first support part and the optical films contacting the second support part.

10. The backlight module as claimed in claim 9, characterized in that the resilient fastening element is made of silicone or rubber.

11. The backlight module as claimed in claim 9, characterized in that the number is resilient fastening plural, and the plurality of resilient fastening elements is disposed with spacing gap on a plurality of sides of the optical part.

12. The backlight module as claimed in claim 11, characterized in that the resilient fastening element is L-shaped, and the L-shaped resilient fastening element is disposed on the corner of optical part and clamping simultaneously on two sides near the corner through positioning trench.

13. The backlight module as claimed in claim 9, characterized in that the positioning trench is U-shaped and fits side interference of the optical part.

14. A liquid crystal display device, characterized in that the liquid crystal display device comprises a liquid crystal panel and a backlight module as claimed in claim 9, wherein the second support part being disposed between the optical film and the liquid crystal panel to support the liquid crystal panel.

15. The liquid crystal display device as claimed in claim 14, characterized in that the resilient fastening element is made of silicone or rubber.

16. The liquid crystal display device as claimed in claim 14, characterized in that the positioning trench is U-shaped and fits side interference of the optical part.

* * * * *